United States Patent [19]
Yang

[11] Patent Number: 6,142,792
[45] Date of Patent: Nov. 7, 2000

[54] SOCKET CONNECTOR

[75] Inventor: Robert Yang, Tu-Chen, Taiwan

[73] Assignee: Hon Hai Precision Ind. Co., Ltd., Taipei Hsien, Taiwan

[21] Appl. No.: 09/348,721

[22] Filed: Jul. 6, 1999

[30] Foreign Application Priority Data

Dec. 28, 1998 [TW] Taiwan ................................ 87221646

[51] Int. Cl.$^7$ .................................................. H01R 12/00
[52] U.S. Cl. ................................................. 439/70; 439/71
[58] Field of Search .............................. 439/70, 71, 525, 439/330

[56] References Cited

U.S. PATENT DOCUMENTS

| | | | |
|---|---|---|---|
| 5,076,794 | 12/1991 | Ganthier | 439/70 |
| 5,641,945 | 6/1997 | Abe et al. | 439/70 |
| 5,669,774 | 9/1997 | Grabbe | 439/70 |
| 5,810,609 | 9/1998 | Faraci et al. | 439/71 |
| 5,980,270 | 11/1990 | Fjelstad et al. | 439/71 |

*Primary Examiner*—T. C. Patel
*Attorney, Agent, or Firm*—Wei Te Chung

[57] ABSTRACT

A socket connector includes an insulative body defining a number of chambers each retaining a contact element. The chambers receive solder balls of an integrated circuit (IC) module therein to form electrical engagement between each contact element and the corresponding solder ball of the IC module. The contact element has a trifurcated end including a central branch and two side branches which are bent in opposite directions thereby defining a space therebetween for receiving and securely retaining the solder ball. The side branches are spaced from each other for partially receiving the solder ball therebetween. Each side branch has a sharp edge that cuts through an oxidation layer formed on the solder ball thereby eliminating high impedance caused by the oxidation layer.

6 Claims, 3 Drawing Sheets

SOCKET CONNECTOR

BACKGROUND OF THE INVENTION

1. Field of the Invention

The present invention generally relates to a socket connector, and in particular to a trifurcated contact element of a socket connector for providing a reliable electrical engagement with a solder ball of an integrated circuit (IC) module.

2. The Prior Art

Ball grid array (BGA) socketing technique is well known in the electronics field. An IC module has a number of pins each having a solder ball attached thereto. A socket connector defines a number of contact chambers each retaining a contact element therein. The solder balls of the IC module are received in the chambers and form electrical engagement with the contact elements. The contact elements may be single finger members each having a single portion engaging with the solder ball or multiple finger members each having at least two portions engaging with the solder ball. U.S. Pat. Nos. 5,641,945, 5,702,255 and 5,730,606 and Taiwan Patent Application No. 85108360 disclose conventional BGA socketing systems.

The single finger contact of the conventional BGA socketing system does not provide reliable engagement with the solder ball of the IC module. In addition, the conventional multiple finger contact is complicated in structure and requires a sophisticated manufacturing process, leading to high costs. Furthermore, an oxidation layer is usually formed around the solder ball which increases the electrical impedance between the solder ball and the corresponding contact of the socket connector. The conventional BGA socketing system provides no means to overcome such a problem.

It is thus desired to have a BGA socket connector which overcomes the problems discussed above.

SUMMARY OF THE INVENTION

Accordingly, an object of the present invention is to provide a socket connector which can be reliably connected with an IC module.

Another object of the present invention is to provide a socket connector having contact elements with trifurcated ends for providing a secure and reliable engagement with solder balls of an IC module.

A further object of the present invention is to provide a contact element of a socket connector having a trifurcated end for securely retaining a solder ball therein.

A still further object of the present invention is to provide a contact element forming a trifurcated end having spaced branches with sharp edges for partially cutting through an oxidation layer of a solder ball thereby eliminating high impedance resulting from the oxidation layer.

A still further object of the present invention is to provide a contact element of a socket connector that is suitable for mass production at a low cost.

To achieve the above objects, a socket connector in accordance with the present invention comprises an insulative body defining a number of chambers each retaining a contact element. The chambers receive solder balls of an integrated circuit (IC) module therein to form electrical engagement between each contact element and the corresponding solder ball of the IC module. The contact element has a trifurcated end including a central branch and two side branches which are bent in opposite directions thereby defining a space therebetween for receiving and securely retaining the solder ball. The side branches are spaced from each other for partially receiving the solder ball therebetween. Each side branch has a sharp edge that cuts through an oxidation layer formed on the solder ball thereby eliminating high impedance caused by the oxidation layer.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
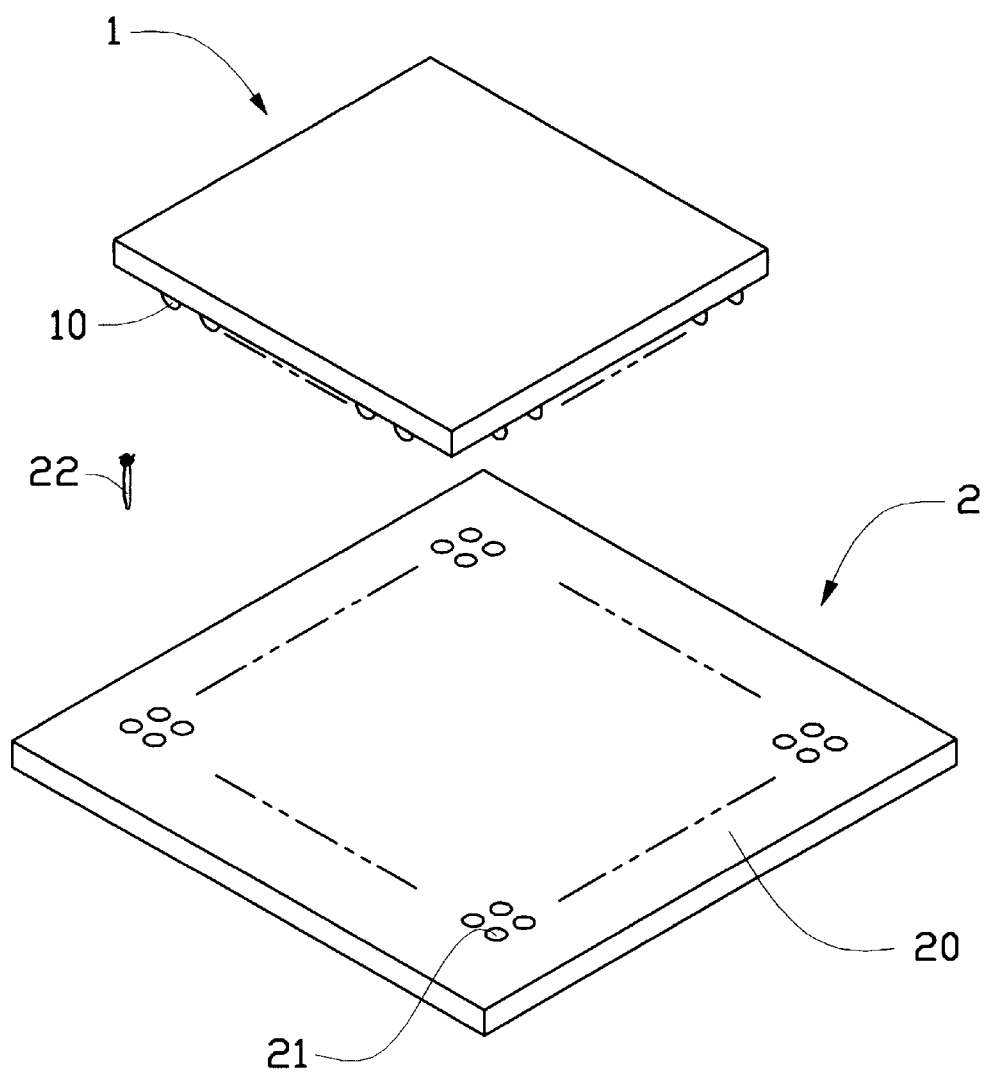
FIG. 1 is an exploded view of a socket connector constructed in accordance with the present invention to which an IC module is mounted.

Referring to the drawings and in particular to FIG. 1, a socket connector 2 constructed in accordance with the present invention comprises an insulative socket body 20 defining a number of chambers 21 each retaining a contact element 22 therein. The chambers 21 receive solder balls 10 formed on an underside of an integrated circuit (IC) module 1 thereby forming electrical engagement between the solder balls 10 and the contact elements 22.

Figure 2:
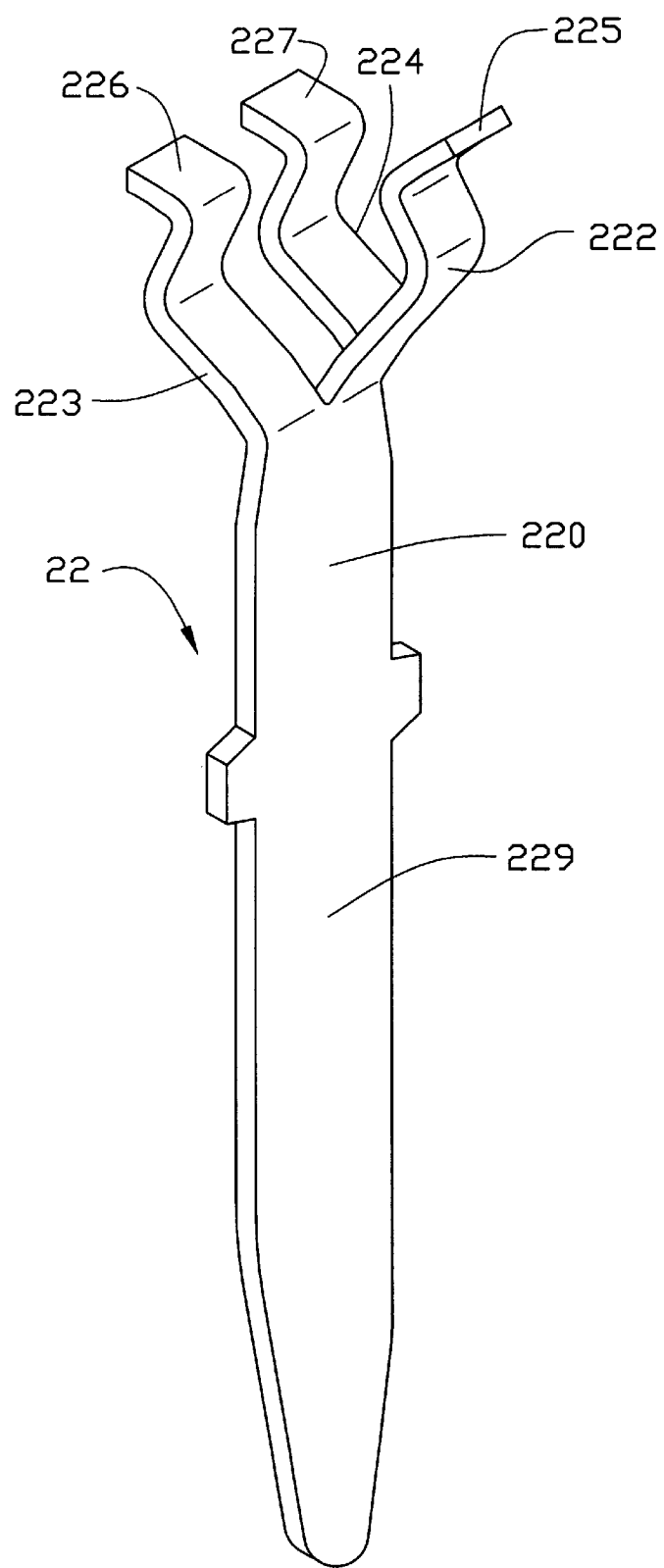
FIG. 2 is an enlarged view of a contact of the socket connector of the present invention.
Figure 3:
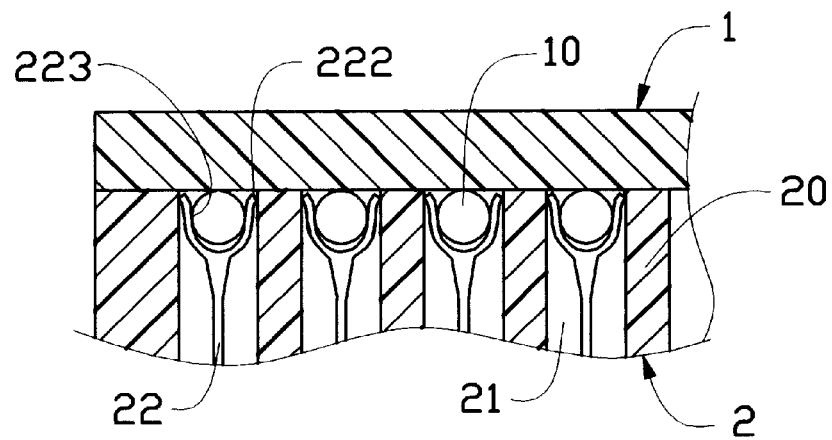
FIG. 3 is a cross-sectional view showing the contact elements of the socket connector receiving and engaging with solder balls of the IC module.

Referring to FIG. 2, each contact element 22 comprises an elongate body 229 having a first end (not labeled) extending beyond a lower face of the socket connector 2 for connecting with a circuit board (not shown) and a second end 220 forming a trifurcated configuration having a central branch 222 and two side branches 223, 224. The branches 222, 223, 224 are alternately bent in opposite directions whereby the central branch 222 and the side branches 223, 224 extend in opposite directions thereby defining a space (not labeled) therebetween for receiving the corresponding solder ball 10 as shown in FIG. 3. Preferably, each branch 222, 223, 224 has an inward projection 225, 226, 227 which forms a snap fit with the solder ball 10 thereby securely retaining the solder ball 10 in the space between the branches 222, 223, 224.

Figure 4:
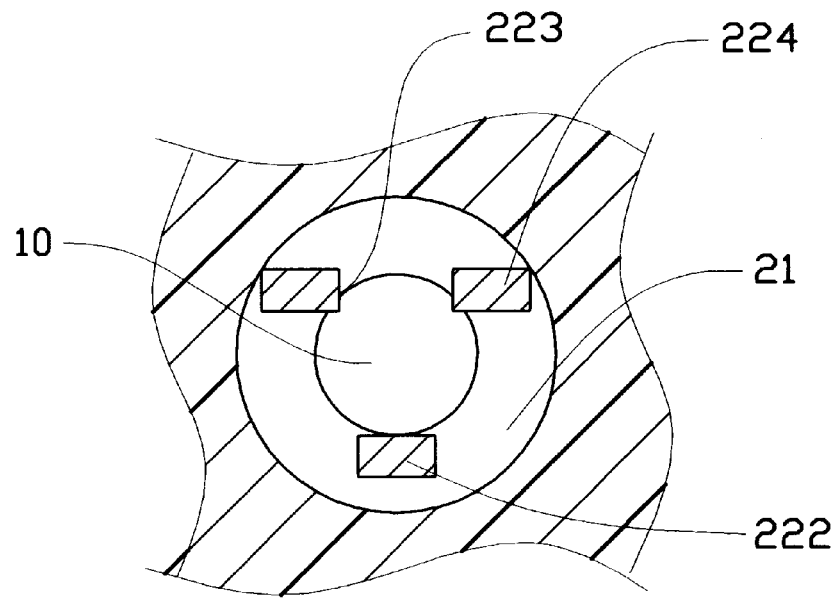
FIG. 4 is a top sectional view showing a spatial relationship between branches of the contact element and the solder ball.

The trifurcated configuration of the contact element 22 arranges the side branches 223, 224 substantially in alignment with and spaced from each other as shown in FIG. 4. The solder ball 10 is partially received in the space between the side branches 223, 224. Preferably, the side branches 223, 224 are provided with sharp edges which may partially penetrate an outer surface of the solder ball 10 thereby scraping away an oxidation layer formed on the solder ball 10 and thus eliminating the high impedance resulting from the oxidation layer.

The trifurcated configuration of the contact element 22 may be simply formed by a metal forming or stamping process. The stamping process forms the sharp edges on the branches 222, 223, 224. Thus, the manufacturing process of the contact element is simplified and mass production thereof may be easily achieved.

Although the present invention has been described with reference to the preferred embodiment, it is apparent to those skilled in the art that a variety of modifications and changes may be made without departing from the scope of the present invention which is intended to be defined by the appended claims.

What is claimed is:

1. A socket connector comprising an insulative body defining a number of chambers each retaining a contact element, the chambers being adapted to receive solder balls of an external electronic device therein to form electrical engagement between each contact element and the corresponding solder ball of the external electronic device, the contact element comprising a trifurcated end having a central branch and two side branches, the central branch being bent in a direction opposite to the direction in which the side branches are bent, thereby defining a space therebetween for receiving the solder ball, each branch having a rectangular cross-section, each side branch having a sharp corner partially cutting through the solder ball and the central branch having a side abutting the solder ball.

2. The socket connector as claimed in claim 1, wherein the side branches are spaced from each other and are aligned with each other, defining a space therebetween for partially receiving the solder ball, and the central branch is parallel to the side branches.

3. A contact element adapted to be received and retained in a chamber defined in an insulative body of a socket connector, comprising an elongate body having a trifurcated end forming a central branch and two side branches which are bent in opposite directions thereby defining a space therebetween adapted to receive a solder ball of an external electronic device mounted to the socket connector, the side branches being substantially aligned with and spaced from each other, each side branch having a sharp edge facing each other for partially cutting through the solder ball.

4. The contact element as claimed in claim 3, wherein each branch has an inward projection.

5. The contact element as claimed in claim 3, wherein the contact element is formed by stamping.

6. A socket connector assembly comprising:

an insulative body defining a number of chambers each receiving a contact element, and an external device with a plurality of solder balls on an underside surface adapted to be received within the corresponding chambers to form electrical engagement between each contact element and the corresponding solder ball of the external electronic device; wherein the contact element comprises a plurality of split branches at a distal tip which are alternatively bent in opposite directions thereby defining a space therebetween for receiving the corresponding solder ball under a condition that all the split branches respectively engage with the solder ball in different radial positions and some of said branches each includes a sharp edge partially cutting through the corresponding solder ball while others of said branches each includes a side abutting the solder ball.

* * * * *